(12) United States Patent
Kiryuschev et al.

(10) Patent No.: US 6,603,259 B1
(45) Date of Patent: Aug. 5, 2003

(54) ELECTROLUMINESCENT DEVICE AND METHOD OF MANUFACTURING SAME

(75) Inventors: Irina Kiryuschev, Tel Aviv (IL); Lev Zaidenberg, Raanana (IL)

(73) Assignee: Visson IP, LLC, Dover, DE (US)

( * ) Notice: Subject to any disclaimer, the term of this patent is extended or adjusted under 35 U.S.C. 154(b) by 0 days.

(21) Appl. No.: 09/646,413
(22) PCT Filed: Mar. 12, 1999
(86) PCT No.: PCT/US99/05452
§ 371 (c)(1), (2), (4) Date: Sep. 18, 2000
(87) PCT Pub. No.: WO99/48124
PCT Pub. Date: Sep. 23, 1999

(51) Int. Cl.$^7$ .................................................. H01J 1/62
(52) U.S. Cl. ........................ 313/505; 313/5.3; 313/506; 313/509
(58) Field of Search ................................. 313/500, 491, 313/505, 587, 631, 503, 506, 509, 512, 586

Primary Examiner—Vip Patel
(74) Attorney, Agent, or Firm—Mark M. Friedman

(57) ABSTRACT

An electroluminescent device which includes a close arrangement including a first set of fibers and a second set of fibers being arranged to form a two dimensional close array of junctions between fibers of the first set of fibers and fibers of the second set of fibers, wherein each of the fibers includes a longitudinal conductive element, whereas fibers of at least one of the first and second sets of fibers further include a longitudinal coat of at least one light emitting substance being in intimate contact with the conductive element, the at least one light emitting substance is selected such that on applying an electric field between crossing conductive elements, radiation is emitted from the light emitting substance.

28 Claims, 3 Drawing Sheets

ELECTROLUMINESCENT DEVICE AND METHOD OF MANUFACTURING SAME

FIELD AND BACKGROUND OF THE INVENTION

The present invention relates to an electroluminescent device and further to a method of manufacturing same. More particularly, the present invention relates to an electroluminescent device in which the light-emitting substance is a semiconductor. Most particularly, the present invention relates to a storable information display screen for use with an electronic information processing device, in which the light-emitting substance is a light emitting polymer (LEP).

Electroluminescent devices are structures which emit light when subject to an applied electric field. The usual model for the physical process in a semiconductor used in this way is through the radiative combination of electron-hole pairs which are injected into the semiconductor from opposite electrodes. Common examples are light-emitting diodes based on GaP and similar III–V semiconductors.

Although these devices are efficient and are widely used, they are limited in size, and are not easily or economically used in large area displays.

Alternative materials which can be prepared over large areas are known, and among these are the inorganic semiconductors. Most effort has been directed to ZnS.

However, the ZnS system has considerable practical drawbacks, primarily poor reliability. The mechanism in ZnS is believed to be one where acceleration of one type of carrier through the semiconductor under a strong electric field causes local excitation of the semiconductor which relaxes through radiative emission.

Among organic materials, simple aromatic molecules such as anthracene, perylene and coronene are known to show electroluminescence.

Nevertheless, the practical difficulty with these materials is, as with ZnS, their poor reliability, together with difficulties in deposition of the organic layers and the current-injecting electrode layers.

Techniques such as sublimitation of the organic material suffer from the disadvantage that the resultant layer is soft, prone to recrystalization, and unable to support high temperature deposition of top-contact layers.

Techniques such as Langmuir-Blodgett film deposition of suitably-modified aromatics suffer from poor film quality, dilution of the active material, and high cost of fabrication.

An electroluminescent device utilizing anthracene is disclosed in U.S. Pat. No. 3,621,321. This device suffers from high power consumption and low luminescence. In an attempt to provide an improved device, U.S. Pat. No. 4,672,265 describes an electroluminescent device having a double layer structure as its luminescent layer. However, the suggested materials for the double layer structure are organic materials which suffer from the disadvantages mentioned above.

Light emitting polymers (LEPs) are expected to revolutionize the monitor and computer display, since LEP based display may be manufactured very thin and collapsible, e.g., rollable or foldable.

U.S. Pat. No. 5,399,502, which is incorporated by reference as if fully set forth herein discloses an electroluminescent device which includes (k) a semiconductor layer in a form of a thin deuse polymer film comprising at least one conjugated polymer; (ii) a first contact layer in contact with a first surface of the semiconductor layer; and (iii) a second contact layer in contact with a second surface of the semiconductor layer.

The polymer film of the semiconductor layer has a sufficiently low concentration of extrinsic charge carriers, so that on applying an electric field between the first and second contact layers across the semiconductor layer, so as to render the second contact layer positive relative to the first contact layer, charge carriers are injected into the semiconductor layer and radiation is emitted from the semiconductor layer.

U.S. Pat. No. 5,399,502 further discloses a method of manufacturing the above described electroluminescent device which includes steps of depositing a thin layer of a precursor polymer onto a substrate and then heating the precursor polymer to a high temperature to form the conjugated polymer.

The invention disclosed in U.S. Pat. No. 5,399,502 is based on the discovery that semiconductive conjugated polymers can be caused to exhibit electroluminescence by the injection of charge carriers from suitable contact layers.

However, the electroluminescent device described in U.S. Pat. No. 5,399,502 suffers several limitations.

First, being a laminate, the device is expected to be limited in the degree allowed collapsibility, since under high collapse strain, the layers of the laminate are expected to either break or become separated, in either case, functionality will be severely and irreversibly hampered.

Second, the device requires a thick on-luminescent base substrate for mechanical support.

Third, being a laminate, the device is inherently manufactured using e.g., lithography or other complicated procedures, which are, in most cases, to be conducted under special conditions, such as, but not limited to, vacuum, and are therefore cumbersome and cost and effort demanding. Furthermore, the use of lithography limits the maximal size of devices obtainable.

There is thus a widely recognized need for, and it would be highly advantageous to have, an electroluminescent device devoid of the above inherent limitations.

SUMMARY OF THE INVENTION

According to the present invention there is provided an electroluminescent device and a method of manufacturing same.

According to further features in preferred embodiments of the invention described below, there is provided an electroluminescent device comprising a close arrangement including a first set of fibers and a second set of fibers being arranged to form a two dimensional close array of junctions between fibers of the first set of fibers and fibers of the second set of fibers, wherein each of the fibers includes a longitudinal conductive element, whereas fibers of at least one of the first and second sets of fibers further include a longitudinal coat of at least one light emitting substance being in intimate contact with the conductive element, the at least one light emitting substance is selected such that on applying an electric field between crossing conductive elements, radiation is emitted from the light emitting substance.

The electric field applied may be of a constant direction or alternatively of an alternating direction, depending on the luminescent material employed.

According to further features in preferred embodiments of the invention described below, there is provided a storable information display screen for use with an electronic information processing device comprising an electroluminescent device as described above.

According to further features in preferred embodiments of the invention described below, there is provided a method of manufacturing an electroluminescent device comprising the steps of (a) providing first set of fibers and a second set of fibers, each of the fibers including a longitudinal conductive element, whereas fibers of at least one of the first and second sets of fibers further include a coat of at least one light emitting substance being in intimate contact with the conductive element; and (b) arranging the fibers of the first and second sets of fibers to form a two dimensional close array of junctions therebetween, the at least one light emitting substance being selected such that on applying an electric field between crossing conductive elements, so as to render one of the crossing conductive elements positive relative to the other, radiation is emitted from the light emitting substance.

According to still further features in the described preferred embodiments the light emitting substance is a semiconductive polymer has a sufficiently low concentration of extrinsic charge carriers, such that when charge carriers are injected into the semiconductor coat from the conductive elements, radiation is emitted from the polymer.

According to still further features in the described preferred embodiments the longitudinal conductive element is a core and the longitudinal cost of at least one light emitting substance coating the core.

According to still further features in the described preferred embodiments fibers of both the first and second sets of fibers include the conductive element and the coat of the light emitting substance.

According to still further features in the described preferred embodiments the at least one light emitting polymer is poly (p-phenylenevinylene) or a derivative thereof.

According to still further features in the described preferred embodiments fibers including the coat of light emitting substance are about 10 micrometer to and 2 centimeters in width.

According to still further features in the described preferred embodiments the conductive element includes a substance selected from the group consisting of metal, metal oxide, alloy, a conductive polymer and combinations thereof.

According to still further features in the described preferred embodiments the substance is selected from the group consisting of aluminum, aluminum oxide, gold, magnesium/silver alloy, indium oxide and combinations thereof.

According to still further features in the described preferred embodiments the conductive element of each of the fibers including the coat of light emitting substance is about 50–99% of the total thickness of the fibers.

According to still further features in the described preferred embodiments the fibers of the first set of fibers and the fibers of the second set of fibers are arranged substantially perpendicularly to one another.

According to still further features in the described preferred embodiments the fibers of the first set of fibers and the fibers of the second set of fibers are interlocked in a woven arrangement.

According to still further features in the described preferred embodiments the device further comprising an implement for applying the electric field between crossing conductive elements.

The present invention successfully addresses the shortcomings of the presently known configurations by providing a fibers based electroluminescent device which is highly collapsible and simple to manufacture.

BRIEF DESCRIPTION OF THE DRAWINGS

The invention herein described, by way of example only, with reference to the accompanying drawings, wherein.

DESCRIPTION OF THE PREFERRED EMBODIMENTS

Figure 1:
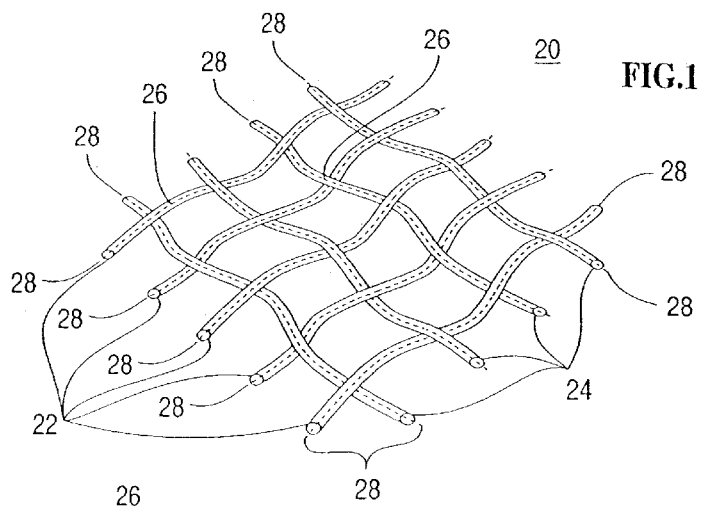
FIGS. 1 and 2 are perspective views of an electroluminescent device according to the present invention.

The present invention is of an electroluminescent device which can be used to provide a storable information display screen for use with an electronic information processing device. Specifically, the present invention can be used to provide electroluminescent devices in which the light-emitting substance is a semiconductor Most specifically, the present invention can be used to provide fibrous, non-laminate electroluminescent devices of high collapsibility.

The principles and operation of an electroluminescent device according to the present invention may be better understood with reference to the drawings and accompanying descriptions.

Before explaining at least one embodiment of the invention in detail, it is to be understood that the invention is not limited in its application to the details of construction and the arrangement of the components set forth in the following description or illustrated in the drawings. The invention is capable of other embodiments or of being practiced or carried out in various ways. Also, it is to be understood that the phraseology and terminology employed herein is for the purpose of description and should not be regarded as limiting.

Referring now to FIGS. 1–6, the present invention provides in one aspect an electroluminescent device 20.

Figure 2:
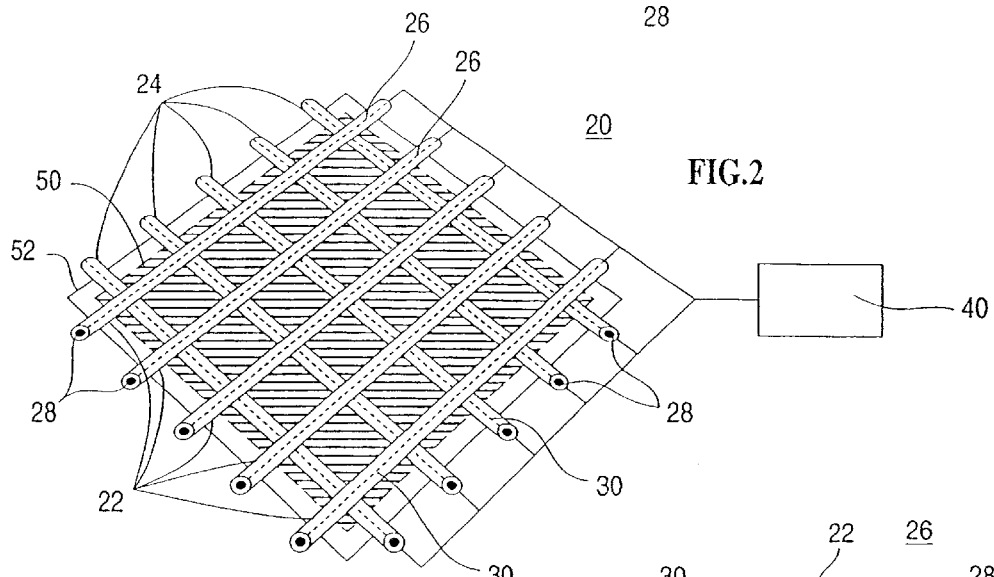

Device 20 includes a close arrangement of fibers which includes a first set of fibers 22 and a second set of fibers 24. As best seen in FIGS. 1 and 2, fibers 22 and 24 are arranged to form a two dimensional close array of junctions 26 therebetween, such that each of fibers 22 crosses only once a given fiber 24, and vice versa. Each of fibers 22 and 24 includes a longitudinal conductive element, typically a core 28. Fibers of at least one of the first and second sets of fibers, i.e., fibers 22 and/or 24, further include a longitudinal coat of light emitting substance, typically a semicondutive coat 30 of at least one light emitting conjugated polymer coating and being in intimate contact with conductive element 28.

The light emitting conjugated polymer(s) has a sufficiently low concentration of extrinsic charge carriers, so that on applying an electric field between crossing conductive cores 28, so as, for example, to render one of the crossing conductive cores positive relative to the other, charge carriers are injected into semiconductor coat 30 and radiation is emitted from semiconductor coat 30.

Figure 5:
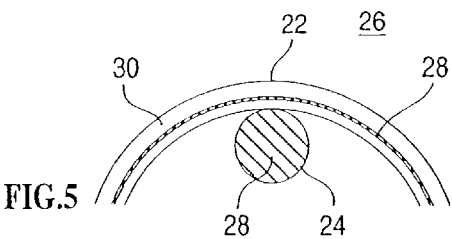
FIGS. 5 and 6 are cross sectional views of junctions formed between crossing fibers according to the present invention.
Figure 6:
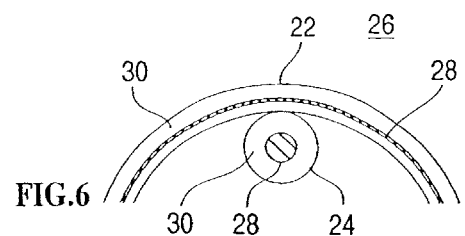

As best seen in FIGS. 5–6, junctions 26 are characterized in that they include two electrodes and a light emitting substance in contact therebetween.

It will be appreciated that the arrangements shown in FIGS. 1–2 are deliberately loose to demonstrate more clearly the concept of the present invention.

The close arrangement of fibers 22 and 24 is selected such that junctions 26 are close enough to one another, so that by controlling the luminesitivity of specific junctions 26 by electric fields provided via element 28, an image of adequate resolution can be perceived by a viewer.

The resolution provided by junctions 26, depends to a great extent on the specific application. For example, a junction every 30–100 micrometers is adequate for fine resolution in computer or television screen applications, however, for larger screens, e.g., street commercial boards, cinema screens, etc., which are viewed from farther away, a lower resolution of, say, a junction every few millimeters or few centimeters, is adequate.

In any case, preferably most of the area of the close arrangement of fibers 22 and 24, say above, 80%, preferably above 90% or more, is covered with junctions 26. This implies that for some applications, such as computer and television screen applications, the width of the fibers is selected small, e.g., 10–100 micrometers, preferably about 50 micrometers, whereas for other applications which employ larger screens, the width of the fibers is selected larger, e.g., 100 micrometers to 2 centimeters.

Whereas small width fibers are either flat or round, large width fibers are preferably flat fibers, e.g., strap like fibers. In the later case, each fiber may includes a first layer of a longitudinal conductive element, and also a second layer or layers of the light emitting substance. In any case the longitudinal conductive element is preferably transparent in the visible range.

Core 28 may be formed of an inner core covered with a conductive substance, to for core 28. Inner core may be selected a dielectric which provides support to the conductive substance.

As specifically shown in FIGS. 1–2, according to a preferred embodiment of the present invention fibers 22 of the first set of fibers and fibers 24 of the second set of fibers are arranged substantially perpendicularly to one another. As shown in FIG. 1, fibers 22 and 24 are preferably interlocked into a woven arrangement, which diminishes the need for a non-luminescent base support. Furthermore, this arrangement diminishes the need for lithography, since electrodes formation is inherent.

As shown in FIG. 2, according to a preferred embodiment device 20 further includes an implement 40 for applying the required electric field between crossing conductive cores 28. One ordinarily skilled in the art would know how to design and control implement 40 to enable the presentation of images by device 20.

In the device of the present invention, fibers of both sets of fibers 22 and/or 24 preferably include both conductive element 28 and at least one light emitting substance 30.

The light emitting substance is preferably a conjugated polymer 30 such as poly (p-phenylenevinylene), whereas conductive element 28 is preferably made of a conductive substance, such as, but not limited to, a metal, metal oxide, alloy, a conductive polymer (e.g., doped semiconductor) or combinations thereof.

For example, the substance from which conductive element 28 is made can be aluminum, aluminum oxide, gold, magnesium/silver alloy, indium oxide or combinations thereof.

Preferably light emitting polymer coat 30 is applied in substantially uniform thickness, and has a semiconductor band gap in the range 1 eV to 3.5 eV.

Furthermore the proportion of the conjugated polymer in the electroluminescent areas of the conjugated polymer coat is sufficient to achieve the precolation threshold for charge transport in the conjugated polymer present in the coat.

Figure 3:
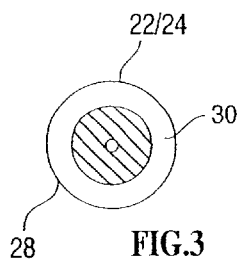
FIGS. 3 and 4 are cross sectional views of fibers according to the present invention having a conductive core and a semiconductor coat, or a conductive (naked) core, respectively.
Figure 4:
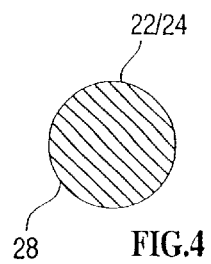

Preferably, conductive element 28 of each of the fibers 22 and/or 24 forms about 50–99% of the total thickness of the fibers. However, as for example shown in FIGS. 4–5, should fibers 22 or 24 are selected to include only a naked core, then their conductive (naked) core 28 diameter may be selected similar to that of the conjugated polymer coated fibers (FIG. 3).

As specifically shown in FIG. 2, device 20 preferably further includes a reflective back layer 50, which serves to reflect light emitted away from a viewer in the viewer's direction. Layer 50 may be a reflective metal which may be applied in any suitable manner, including, but not limited, coating, spraying, etc., to the back of the fibers arrangement.

If further structural stability is required, device 20 may further include a supporting layer 52 which may be deposited on the back or front side thereof. If deposited in the front, supporting layer 52 is selected transparent in the visible range of the spectrum. Layer 52 can be made of any suitably transparent polymer.

A second aspect of the present invention provides a method of manufacture of an electroluminescent device which includes the following steps:

First, a first set of fibers and a second set of fibers are provided, each of the fibers including a longitudinal conductive element formed as a core or layer, whereas fibers of at least one of the first and second sets of fibers further include a longitudinal coat of at least one light emitting substance, preferably semiconductor, light emitting, conjugated polymer. Coated fibers may be prepared, for example, drawing followed by dipping or spraying technology.

Second, fibers of the first and second sets of fibers are arranged to form a two dimensional close array of junctions therebetween, e.g., crossing or woven arrangement. It will be appreciated that weaving fibers into a woven arrangement is a well known and simple technology used in fabric manufacturing.

According to the method of the present invention, the light emitting conjugated substance is selected to have a sufficiently low concentration of extrinsic charge carriers, so that on applying an electric field between crossing conductive cores, so as to render one of the crossing conductive cores positive relative to the other, charge carriers are injected into the semiconductor coat and radiation is emitted from the semiconductor coat.

In an alternative method a woven arrangement of conductive fibers, each being coated with a dielectric coat, is prepared and the woven arrangement is embedded in a luminescent substance. In this case the selected substance luminescence when an electrical field is formed between electrodes of conductive junctions. An example for such a substance is phosphor mixed with epoxy resin.

The term "conjugated polymer" as used herein in the specification and in the claims section below refers to a polymer which possesses a delocalized $\pi$-electron system along the polymer backbone, the delocalized π-electron system confers semiconducting properties to the polymer and gives it the ability to support positive and negative charge carriers with high mobilities along the polymer chain. Such polymers are discussed, for example, by R. H. Friend in Journal of Molecular Electronics 4 (1988) January–March, No. 1, pages 37 to 46.

It is believed that the mechanism underlying the present invention is such that the positive core or layer injects positive charge carriers into the polymer coat(s) and the negative core or layer injects negative charge carriers into the polymer coat(s), these charge carriers combining to form charge carrier pairs which decay radiatively.

To achieve this, preferably the positive core or layer is selected to have a high work function and the negative core or layer to have a low work function (this is feasible in the Example of FIG. 2).

Hence the negative core or layer comprises an electron-injecting material, for example a metal or a doped semiconductor that, when placed in contact with the polymer semiconductor coat(s) present in a junction of fibers and made negative with respect to the polymer semiconductor coat(s) through application of an external potential across the circuit, allows the injection of electrons into the polymer semiconductor coat(s).

The positive core or layer comprises a hole-injecting material, for example a metal or a doped semiconductor that, when placed in contact with the polymer semiconductor coat and made positive with respect to the polymer semiconductor through application of an external potential across the circuit, allows the injection of positive charges, commonly termed "holes", into the polymer semiconductor coat(s) in a junction.

In order to produce the desired electroluminescence, the polymer coats must be substantially free of defects which act as non-radiative recombination centers, since such defects prevent electroluminescence.

Some of all of the conductive cores or layers can include, in addition to the charge injecting material, a further material, preferably an organic material, which serves to control the injection ratio of electrons and holes into the polymer coats and to ensure that radiative decay takes place away from the charge injecting material of the cores or layers.

The coat of conjugated polymer preferably comprises a single conjugated polymer or a single co-polymer which contains segments of conjugated polymer. alternatively, the coat of conjugated polymer may include a blend of a conjugated polymer or copolymer with another suitable polymer.

Further preferred features of the polymer coat are that (i) the polymer should be stable to oxygen, moisture, and to exposure to elevated temperatures; (ii) the polymer coat should have good adhesion to the core or layer, good resistance to thermally-induced and stress-induced cracking, and good resistance to shrinkage, swelling, recrystallization or other morphological changes; and (iii) the polymer coat should be resilient to ion/atomic migration processes, e.g. by virtue of a high crystalinity and high melting temperature.

The coat of conjugated polymer is preferably a film of a poly(p-phenylenevinylene) of formula

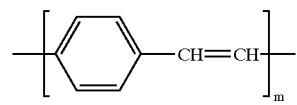

wherein the phenylene ring may optionally carry one or more substituents each independently selected from alkyl (preferably methyl), alkoxy (preferably methoxy or ethoxy), halogen (preferably chlorine or bromine), or nitro.

Other conjugated polymers derived from poly(p-phenylenevinylene) are also suitable for use as the polymer film in the electroluminescent device of the present invention.

Typical examples of such derivatives are polymers derived by:

(i) replacing the phenylene ring in formula (I) with a fused ring system, e.g. replacing the pohenylene ring with an anthracene or naphthalene ring system to give structures such as, but not limited to:

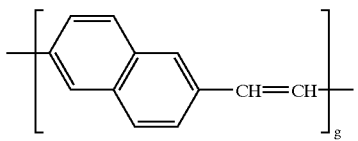

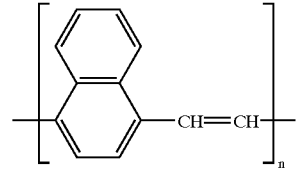

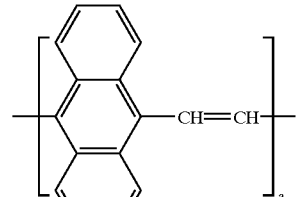

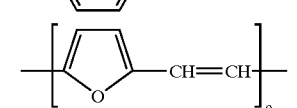

These alternative ring systems may also carry one or more substituents of the type described above in relation to the phenylene ring.

(ii) replacing the phenylene ring with a heterocyclic ring system such as a furan ring to give structures such as, but not limited to:

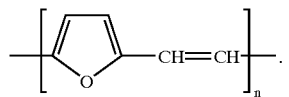

As before, the furan ring may carry one or more substituents of the type described above in relation to phenylene rings.

(iii) increasing the number of vinylene moieties associated with each phenylene ring (or each of the other alternative ring systems described above in (i) and (ii)) to give structures such as, but not limited to:

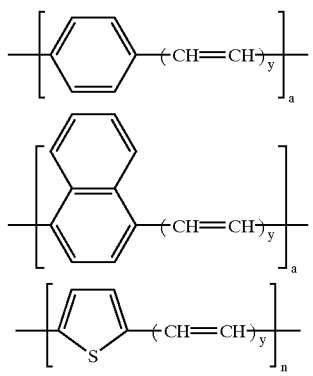

wherein y represents 2, 3, 4, 5, 6, 7 . . .

Once again, the ring systems may carry the various substituents described above.

These various different poly (p-phenylenevinylene) derivatives possess different semiconductor energy gaps. This, in turn, should permit the construction of electroluminescent devices which have emission at different wavelengths covering the entire visible part of the spectrum.

The coat of conjugated polymer may be prepared by means of a chemical and/or thermal treatment of a solution-processible or melt-processible "precursor" polymer. The latter can be purified or pre-processed into the desired form before subsequent transformation to the conjugated polymer via an elimination reaction.

Coats of the various derivatives of poly (p-phenylenevinylene) described above can be applied onto a conducting core or layer in similar manner by using an appropriate sulphonium precursor. In certain circumstances it may be advantageous to use polymer precursors which have a higher solubility in organic solvents than the sulphonium salt precursors (II).

Enhanced solubility in organic solvents can be achieved by replacing the sulphonium moiety in the precursor by a less hydrophilic group such as, but not limited to, an alkoxy group (usually methoxy), or a pyridinium group.

Figure 7:
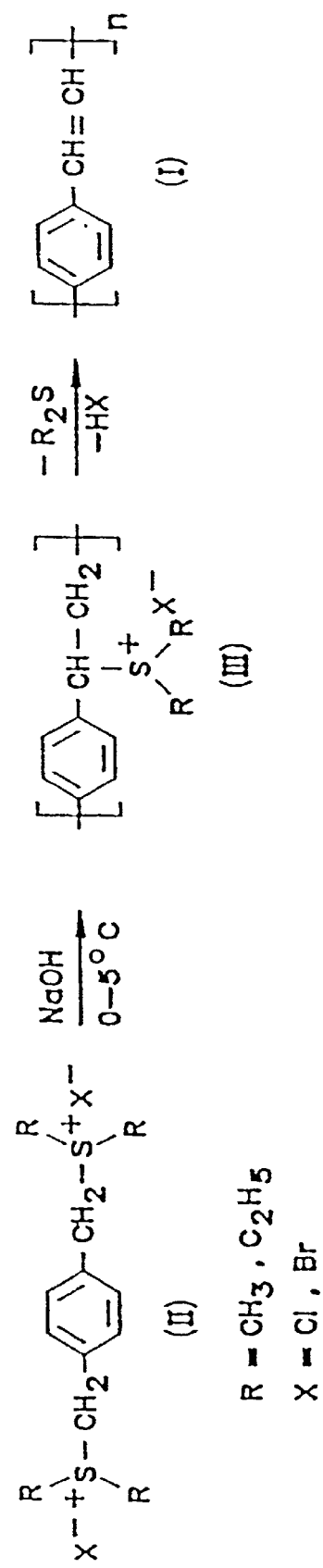
FIG. 7 is a formula drawing showing a reaction scheme for applying a conjugated polymer to a conductive element according to eh present invention.

Typically, a coat of poly(phenylinevinylene) is applied onto a conducting core or layer by a method which relies on a reaction scheme such as is illustrated in FIG. 7.

The sulphonium salt monomer (II) is converted into a precursor polymer (III) in aqueous solution or in a solution of methanol/water, or methanol. Such a solution of the pre-polymer (III) can be applied onto a conducting core or layer by means of standard coating techniques such as, but not limited to, dipping and spraying.

The resultant fiber of precursor-polymer III can then be converted into poly(phenylene vinylene) (I) by heating to temperatures typically in the range 200° C. to 350° C. Details of the conditions necessary for the chemical synthesis of the monomer (II), its polymerization to the precursor (III) and its thermal conversion to poly (p-phenylenevinylene) are described in the literature, for example in D. D. C. Bradley, J. Phys. D (Applied Physics) 20, 1389 (1987); and J. D. Stenger Smith, R. W. Lenz and G. Wegner, Polymer 30, 1048 (1989).

With poly(phenylenevinylene) coats of thickness in the range of 10 nanometers to 10 micrometers can be obtained. These poly (p-phenylenevinylene) coats are found to have a very few pin holes. The poly (p-phenylenevinylene) coat has a semiconductor energy gap of about 2.5 eV (500 nanometers), it is robust, shows little reaction with oxygen at room temperature, and is stable out of air at temperatures well in excess of 300° C.

Enhanced ordering in the conjugated material may be achieved by modifying the leaving group of the precursor polymer to ensure that the elimination proceeds smoothly via a simple reaction without generation of additional intermediate structures.

Thus, for example, the normal dialkyl sulphonium moiety can be replaced with a tetrahydrothiophenium moiety. The latter eliminates as a single leaving group without decomposition, as is seen for dialkyl sulfide, into an alkyl mercaptan.

In the examples described here, the precursor polymers used include both that with the dialkyl sulphonium moiety chosen as dimethyl sulfide and as tetratryebrothiophene.

Both precursors produce coats of poly (p-phenylenevinylene) suitable for use in the device structures described herein.

A further material which may be suitable for forming the coat of conjugated polymer is poly(phenylene). This material may be prepared by starting from biologically synthesized derivatives of 5,6-dihydroxycyclohexa-1,3-dienes. These derivatives can be polymerized by use of radical initiators into a polymer precursor that is soluble in simple organic solvents. This preparation of poly(phenylene) is more fully described in Ballard et al., J. Chem. Soc. Chem. Comm. 954 (1983).

A solution of the polymer precursor can be coated onto a conducting core or layer and then be converted to the conjugated poly(phenylene) polymer by a heat treatment, typically in the range 140° C. to 240° C. Copolymerization with vinyl or diene monomers can also be performed so as to obtain phenylene copolymers.

A further category of materials which can be used to form the required coats of conjugated polymer is a conjugated polymer which is itself either solution processible or melt processible by virtue of the presence of bulky pendant side groups attached to the main conjugated chain or by virtue of the inclusion of the conjugated polymer into a copolymer structure of which one or more components are non-conjugated.

Examples of the former include, but are not limited to:

(a) Poly(4,4'-diphenylenediphenylvinylene) which is an arylene vinylene polymer in which both vinylene carbons are substituted by phenyl rings. It is soluble in common organic solvents thus enabling the preparation of thin films.

(b) Poly(1,4-phenylene-1-phenylvinylene) and poly(1,4-phenylenediphenylvinylene) polymers which are analogs of poly (p-phenylenevinylene) in which respectively one and both vinylene carbons are substituted with phenyl groups. They are both soluble in organic solvents.

(c) Poly(3-alkylthiophene) polymers (alkyl is one of propyl, butyl, pentyl, hexyl, heptyl, octyl, decyl, undecyl, dodecyl, etc.) which are solution processible in common organic solvents and which for longer alkyl sequences (alkyl greater than or equal to octyl) are also melt processible.

(d) Poly(3-alkylpyrrole) polymers which are expected to be similar to the poly(3-alkylthiophene) polymers.

(e) Poly(2,5-dialkoxy-p-phenylenevinylene) polymers with alkyl greater than butyl are solution processible.

(f) Poly(phenylacetylene) which is a derivative of polyacetylene in which the hydrogen atoms along the chain are replaced by phenyl groups. This substitution renders the material soluble.

In some circumstances it may also be appropriate to form polymer blends of the conjugated polymer with other polymers so as to obtain the requires processibility of the polymer and thereby facilitate forming of the required thin uniform coat of the polymer on the conducting core or layer.

When such copolymers or polymer blends are used to form the cost of conjugated polymer, the active regions of the electroluminescent device, i.e., the junctions formed between the crossing fibers, must contain a volume fraction of conjugated polymer which is greater than or equal to the precolation threshold of the copolymer or polymer blend.

The semiconductor electroluminescent coat may be formed as a composite coat with layers of polymers with different band gaps and/or majority charge species so that, for example, concentration of the injected charge, from the charge injecting core or layer, within a particular region (junction) of the electroluminescent device may be achieved. Composite coats may be fabricated, for example, by successive deposition of polymer layers. In the case where coats are deposited in the form of the precursor by dipping, the conversion process to the conjugated polymer renders the coat insoluble, so that subsequent layers may be similar applied without dissolution of the previously deposited coat layer.

Additional materials suitable for the electroluminescent coat are described in, for example, U.S. Pat. No. 5,485,355, which is incorporated by reference as if fully set forth herein.

Reference is now made to the following examples, which together with the above descriptions, illustrate the invention in a non limiting fashion.

EXAMPLES

A charge injecting alluminum fibrous core is prepared by drawing having a diameter of between 30 and 50 micrometers. The aluminum charge injecting core is then exposed to the air to allow formation of a thin surface oxide layer thereon. This layer forms an electron injecting core.

A solution of the precursor to poly (p-phenylenevinylene), in methanol, having a concentration in the range of one gram polymer to 10 to 25 milliliters of methanol, is coated onto the combination core substrate described above. This is achieved, for example, by dipping the core in the poly (p-phenylenevinylene) solution.

The resultant core and precursor polymer coat are then heated in a vacuum oven at a temperature of 300° C. for 12 hours.

This heat treatment converts the precursor polymer to poly (p-phenylenevinylene), and the resultant poly (p-phenylenevinylene) fiber has a thickness in the range of 100 to 300 nanometers. The minimum requirements for the coat thickness is set by the coat's conductance and a lower limit is in the region of 20 nanometers. However, the preferred range of thickness is 20 nanometers to 1 micron or more.

As learned from U.S. Pat. No. 5,399,502, for a device with a thickness of the poly (p-phenylenevinylene) coat of about 200 nm within the junctions (i.e., between the electrodes), the threshold voltage for charge injection and the appearance of strong electroluminescence is expected to be about 40 volts. The voltage is expected to give a threshold electric field of $2 \cdot 10^6$ Vcm$^{-1}$. At a current density of 2 mA/cm$^2$ the light emission through the semitransparent electrodes is expected to be visible by eye under normal lighting conditions. The output of the device are expected to show only weak dependence on frequencies up to 100 kHz. Thus, the response time of the electroluminescent device is expected to be very short, faster than 10 microseconds.

Other materials which are suitable for use as an electron-injecting core because they have a low work function relative to the electroluminescence coat are: alkali and alkaline-earth metals either pure or alloyed with other metals such as Ag. Also "n-type doped" conjugated polymers may be interposed between the core and the electroluminescent polymer coat to form the electron-injecting core.

Other materials which are suitable for use as a hole-injecting contact layer because they have a high work function relative to the electroluminescence coat are: indium/tin oxides (which are advantageous because they are transparent in the visible part of the spectrum), platinum, nickel, palladium and graphite. Also layers of "p-type doped" conjugated polymers, such as electrochemically polymerized polypyrrole or polythiophene may be interposed between the cost and the core to form the hole-injecting coat.

There are actually no limits to the size of the electroluminescent device produced since fibers of any length may be employed as desired. It is therefore feasible that electroluminescent devices using conjugated polymers with areas of square meters may be constructed.

The electroluminescent device according to the present invention may be used in a variety of ways where electroluminescence is of use. It may be used where traditionally liquid crystals have been used, the electroluminescent device having many properties which make it a desirable alternative to liquid crystals.

Since the electroluminescent device is light-emitting in contrast to liquid crystal displays, the viewing angle is wide. Further, large area electroluminescent devices can be achieved where problems associated with substrate flatness and spacing have been encountered with large area liquid crystal displays. The electroluminescent device according to the present invention is particularly suitable for matrix-addressed displays, for example, televisions and computer displays. The matrix-addressing of individual electroluminescent unit called pixels of the display is achieved by the selection of the fibers arrangement to form junctions there amongst as described herein. Since the electroluminescent device has such a high speed of response then the electroluminescent device is suitable for use as a television screen, particularly since the color of the emitted light may be controlled through the choice of the conjugated polymer and so its semiconductor band gap and so color display using green, red and blue pixels, suitable for color mixing, are possible through the location of different fibers in the electroluminescent device, or preferably through the integration of three devices as described into a single arrangement, each of the integrated devices is dedicated to emit in one of the red, green and blue colors.

Electroluminescent devices may also be used as individual shape elements for indicators in vehicle dashboards, and on cookers or video recorders, for example. Each element can be produced in the required shape for the intended application. Furthermore the electroluminescent device need not be flat and could, for example, be formed after fabrication, to follow contours in three dimensions for example the contours of the widescreen in a vehicle or aircraft. This is easily applicable since the fibers arrangement of the device is highly flexible in nature. Furthermore, highly collapsible such as rollable or foldable screens may easily be provided using the technology herein disclosed.

Figure 8:
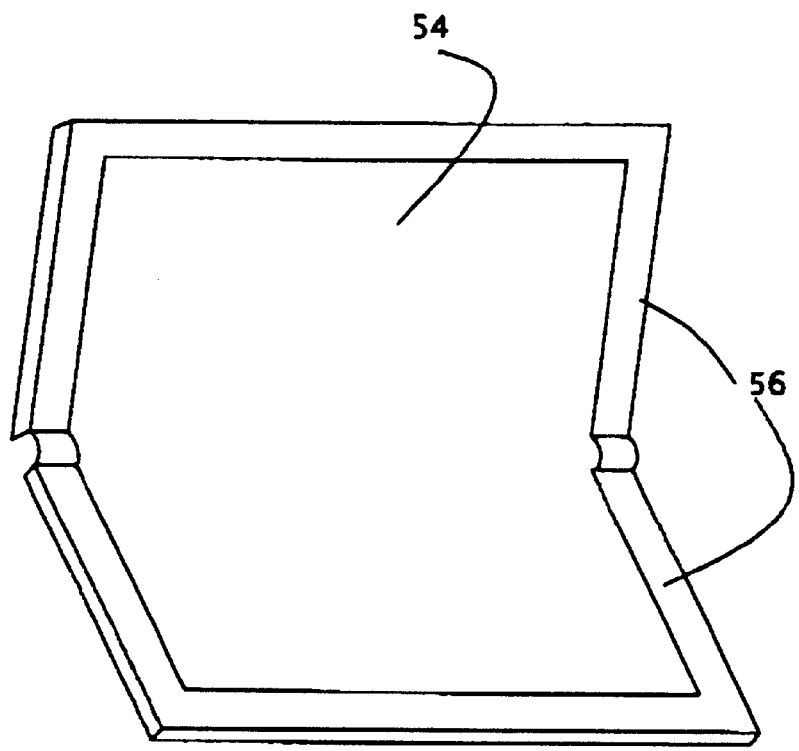
FIG. 8 is a foldable screen.

A foldable screen, FIG. 8, includes an electroluminescent device 54, comprising a close arrangement of a first set of conductive fibers and a second set of conductive fibers being arranged to form a close two dimensional array of junctions between fibers of said first set of fibers and fibers of said second set of fibers, whereas fibers of least one of said first and second sets of fibers further include a longitudinal coat of at least one light emitting substance being in intimate contact with said conductive element, said at least one light emitting substance is selected such that on applying an electric field between crossing conductive elements, radiation is emitted from said light emitting substance.

Alternatively, the electroluminescent device comprises a woven arrangement of conductive fibers wherein each of said fibers (or at least one of warp or weft) is coated with a dielectric coat, said arrangement is embedded in a luminescent substance selected such that on applying an electric field between crossing conductive fibers, light is emitted from said luminescent substance, and a foldable frame supports said electroluminescent device 56.

Figure 9:
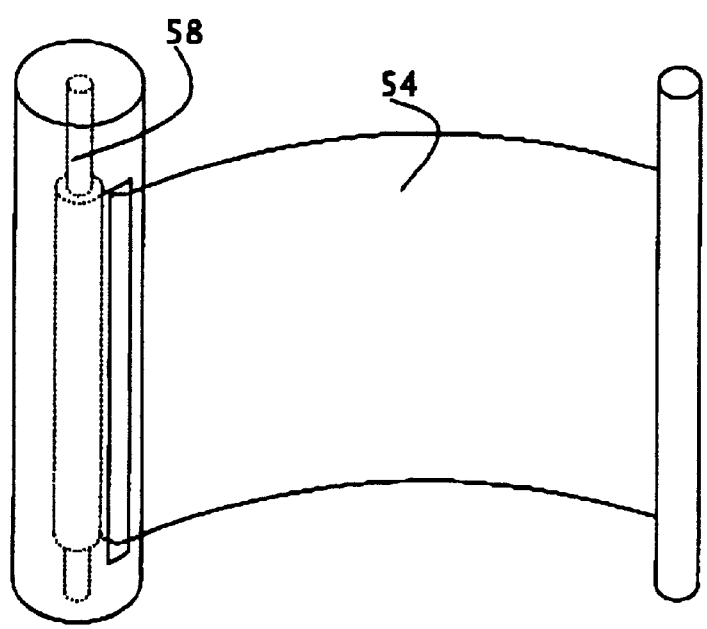
FIG. 9 is a rollable screen.

A rollable screen, FIG. 9, includes a bidirectionally rollable axis 58 and the same electroluminescent device 54 as described in FIG. 8.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

What is claimed is:

1. An electroluminescent device comprising a close arrangement of a first set of fibers and a second set of fibers, wherein each of said fibers includes a longitudinal conductive element and a longitudinal dielectric coating, said close arrangement being embedded in a luminescent substance.

2. The device of claim 1, wherein said luminescent substance is a semiconductive polymer having a sufficiently low concentration of extrinsic charge carriers, such that when charge carriers are injected into said semiconductor coat from said conductive elements, radiation is emitted from said polymer.

3. The device of claim 1, wherein said longitudinal conductive element is a core and said longitudinal dielectric coating is a coating of said core.

4. The device of claim 2, wherein said luminescent substance is phosphor mixed with epoxy resin.

5. The device of claim 1, wherein said fibers including said conductive element, said dielectric coating and said luminescent substance wherein said fibers are embedded are about 10 micrometers to about 2 centimeters in width.

6. The device of claim 1, wherein said conductive element includes a substance selected from the group consisting of metal, metal oxide, alloy, a conductive polymer and combinations thereof.

7. The device of claim 6, wherein said substance is selected from the group consisting of aluminum, aluminum oxide, gold/magnesium/silver alloy, indium oxide and combinations thereof.

8. The device of claim 1, wherein said conductive element of each of said fibers, is about 50–99% of the collective thickness of said fibers and said luminescent substance wherein said fibers are embedded.

9. The device of claim 1, wherein said fibers of said first set and said fibers of said second set are arranged substantially perpendicular to one another.

10. The device of claim 1, wherein said fibers of said first set and said fibers of said second set are interlocked in a woven arrangement.

11. The device of claim 1, further comprising an implement for applying said electric field between crossing conductive elements.

12. A storable information display screen for use with an electric information processing device comprising an electroluminescent device including a close arrangement of a first set of fibers and a second set of fibers, wherein each of said fibers includes a longitudinal conductive element and a longitudinal dielectric coating, said close arrangement being embedded in a luminescent substance.

13. The device of claim 12, wherein said luminescent substance is a semiconductive polymer having a sufficiently low concentration of extrinsic charge carriers, such that when charge carriers are injected into said semiconductor coat from said conductive elements, radiation is emitted from said polymer.

14. The device of claim 12, wherein said longitudinal conductive element is a core and said longitudinal dielectric coating is a coating of said core.

15. The device of claim 13, wherein said luminescent substance is phosphor mixed with epoxy resin.

16. The device of claim 12, further comprising a foldable frame that supports said electroluminescent device.

17. The device of claim 12, further comprising a bidirectionally-rollable axis that supports said electroluminescent device.

18. A method of manufacturing an electroluminescent device comprising the steps of:

(a) providing a first set of fibers and a second set of fibers, each of said fibers including a longitudinal conductive element and a longitudinal coating consisting of a dielectric substance, (b) arranging said fibers of said first and second sets of fibers to form a two dimensional close array of junctions therebetween, and (c) embedding said two dimensional close array of junctions in a luminescent substance such that a coating of said luminescent substance is applied to said close array of junctions, said luminescent substance being selected such that when an electric field is formed between crossing conductive elements at said junctions, radiation is emitted from said luminescent substance.

19. The method of claim 18, wherein said luminescent substance is a semiconductive polymer having a sufficiently low concentration of extrinsic charge carriers, such that when charge carriers are injected into said semiconductor coat from said conductive elements, radiation is emitted from said polymer.

20. The method of claim 18, wherein said longitudinal conductive element is a core and said longitudinal coating of a dielectric substance is a coating of said core.

21. The method of claim 19, wherein said at least one luminescent substance is phosphor mixed with epoxy resin.

22. The method of claim 18, wherein fibers including said conductive elements, said coating of a dielectric substance and said luminescent substance wherein said fibers are embedded are about 10 micrometers to about 2 centimeters in width.

23. The method of claim 18, wherein said conductive element includes a substance selected from the group consisting of metal, metal oxide, alloy, a conductive polymer and combinations thereof.

24. The method of claim 23, wherein said substance is selected from the group consisting of aluminum, aluminum oxide, gold/magnesium/silver alloy, indium oxide and combinations thereof.

25. The method of claim 18, wherein said conductive element of each of said fibers, including said luminescent substance coating is about 50–99% of the total thickness of said fibers.

26. The method of claim 18, wherein said fibers of said first set of fibers and said fibers of said second set of fibers are arranged substantially perpendicular to one another.

27. The method of claim 18, wherein said fibers of said first set of fibers and said fibers of said second set of fibers are interlocked in a woven arrangement.

28. The method of claim 18, further comprising the step of connecting to said fibers an implement for applying said electric field between crossing conductive elements.

* * * * *